United States Patent
Wedin et al.

(10) Patent No.: US 8,339,181 B2
(45) Date of Patent: Dec. 25, 2012

(54) LOW-SIDE DRIVER HIGH-VOLTAGE TRANSIENT PROTECTION CIRCUIT

(75) Inventors: Alex Wedin, Tucson, AZ (US); Dale Trumbo, Tucson, AZ (US); Paul Stevens, Oro Valley, AZ (US)

(73) Assignee: Honeywell International Inc., Morristown, NJ (US)

( * ) Notice: Subject to any disclaimer, the term of this patent is extended or adjusted under 35 U.S.C. 154(b) by 511 days.

(21) Appl. No.: 12/613,363

(22) Filed: Nov. 5, 2009

(65) Prior Publication Data

US 2011/0102055 A1 May 5, 2011

(51) Int. Cl.
*H03K 17/00* (2006.01)

(52) U.S. Cl. ............ 327/434; 327/427; 363/56.01; 363/56.02

(58) Field of Classification Search .......... 327/427, 327/433–436, 379–381; 363/17, 55, 56.01–56.05, 363/98
See application file for complete search history.

(56) References Cited

U.S. PATENT DOCUMENTS

| | | | | |
|---|---|---|---|---|
| 4,500,802 A * | 2/1985 | Janutka | ............ | 327/432 |
| 5,003,246 A * | 3/1991 | Nadd | ............ | 323/349 |
| 5,057,715 A | 10/1991 | Larsen et al. | | |
| 5,424,892 A | 6/1995 | Topp et al. | | |
| 5,583,384 A * | 12/1996 | Henry | ............ | 307/113 |
| 5,784,235 A | 7/1998 | Otomo et al. | | |
| 5,874,838 A | 2/1999 | Rees | | |
| 5,880,602 A | 3/1999 | Kaminaga et al. | | |
| 6,043,965 A | 3/2000 | Hazelton et al. | | |
| 6,049,445 A | 4/2000 | Gauthier, Jr. et al. | | |
| 6,194,944 B1 | 2/2001 | Wert | | |
| 6,320,414 B1 * | 11/2001 | Annema et al. | ............ | 326/80 |
| 6,351,157 B1 | 2/2002 | Sharpe-Geisler | | |
| 6,373,318 B1 * | 4/2002 | Dohnke et al. | ............ | 327/427 |
| 6,388,499 B1 | 5/2002 | Tien et al. | | |
| 6,472,906 B2 | 10/2002 | Sanwo et al. | | |
| 6,509,781 B2 * | 1/2003 | Dufort | ............ | 327/434 |
| 6,556,400 B1 | 4/2003 | Motz et al. | | |
| 6,614,262 B2 | 9/2003 | Kunz et al. | | |
| 6,876,245 B2 * | 4/2005 | de Buda | ............ | 327/427 |
| 7,138,836 B2 | 11/2006 | Ajit et al. | | |
| 7,282,960 B2 | 10/2007 | Belluomini et al. | | |
| 7,498,862 B2 * | 3/2009 | Ayyagari | ............ | 327/387 |
| 2005/0212568 A1 | 9/2005 | Kitagawa et al. | | |

* cited by examiner

*Primary Examiner* — An Luu
(74) *Attorney, Agent, or Firm* — Ingrassia Fisher & Lorenz, P.C.

(57) ABSTRACT

A low-side driver circuit includes a low-side driver integrated circuit and a controllable switch. The low-side driver integrated circuit is responsive to an on-off command input signal to selectively operate in an ON mode and an OFF mode. The controllable switch is responsive to the on-off command signal to selectively operate in a CLOSED mode and an OPEN mode. The low-side driver integrated circuit and the controllable switch are configured to simultaneously operate in the ON mode and the CLOSED mode, respectively, and in the OFF mode and the OPEN mode, respectively. During a voltage transient the potential will be realized across the controllable switch, thus protecting the lower voltage rated low-side integrated circuit.

11 Claims, 1 Drawing Sheet

LOW-SIDE DRIVER HIGH-VOLTAGE TRANSIENT PROTECTION CIRCUIT

TECHNICAL FIELD

The present invention generally relates to high-voltage transient protection, and more particularly relates to a circuit and method for providing high-voltage transient protection for integrated low-side drivers.

BACKGROUND

Low-side driver integrated circuits are used in numerous and varied systems and environments. A typical low-side driver integrated circuit incorporates a transistor switch with overcurrent protection, and is configured to selectively energize a load, such as a relay, a lamp, or other device, from a voltage source. Low-side driver integrated circuits are appealing due to the relatively small circuit board area these devices cover. However, these devices may not be designed to withstand relatively high voltage transients that may occur in certain systems. For example, some power buses in certain aerospace applications may experience voltage transients of magnitudes that substantially exceed the voltage ratings of most low-side driver integrated circuits.

Presently, the standard solution that is implemented to allow low-side drivers to be installed in systems that experience relatively high voltage transients is to design a discrete driver that comprises numerous discrete components. Although this solution is effective in meeting the need to withstand relatively high-voltage transients, it does suffer certain drawbacks. For example, it increases the overall circuit board area, increases overall cost, and can reduce reliability.

Hence, there is a need for a method of implementing high-voltage transient protection for low-side driver integrated circuits to take advantage of the relatively small circuit board area, the relatively low cost, and relatively high reliability associated with these devices. Furthermore, other desirable features and characteristics of the present invention will become apparent from the subsequent detailed description of the invention and the appended claims, taken in conjunction with the accompanying drawings and this background of the invention.

BRIEF SUMMARY

In one exemplary embodiment, a low-side driver circuit includes a low-side driver integrated circuit and a controllable switch. The low-side driver integrated circuit includes a high-side terminal, a low-side terminal, and a control terminal. The control terminal is adapted to receive an on-off command input signal and is configured, upon receipt of the on-off command input signal, to selectively operate in an ON mode and an OFF mode. In the ON mode, current may flow from the high-side terminal to the low-side terminal may occur. In the OFF mode, current flow from the high-side terminal to the low-side terminal is at least substantially prevented. The controllable switch is connected between the low-side terminal and circuit common. The controllable switch is adapted to receive the on-off command signal and is configured, in response thereto, to selectively operate in a CLOSED mode and an OPEN mode. In the CLOSED mode, the low-side terminal is electrically connected to circuit common. In the OPEN mode, the low-side terminal is electrically isolated from circuit common. The low-side driver integrated circuit and the controllable switch are configured to simultaneously operate in the ON mode and the CLOSED mode, respectively, and in the OFF mode and the OPEN mode, respectively.

In another exemplary embodiment, a low-side driver circuit for selectively energizing a load from a voltage source includes a low-side driver and a controllable switch. The low-side driver integrated circuit includes a high-side terminal, a low-side terminal, and a control terminal. The high-side terminal is adapted to be coupled to the load, and the control terminal is adapted to receive an on-off command input signal. The low-side driver integrated circuit is configured, upon receipt of the on-off command input signal, to selectively operate in an ON mode and an OFF mode. In the ON mode, the low-side driver integrated circuit allows current to flow from the voltage source, through the load and the high-side terminal, to the low-side terminal. In the OFF mode, the low-side driver integrated circuit at least substantially prevents current flow from the voltage source, through the load and the high-side terminal, to the low-side terminal. The controllable switch is connected between the low-side terminal and circuit common. The controllable switch is adapted to receive the on-off command signal and is configured, in response thereto, to selectively operate in a CLOSED mode and an OPEN mode. In the CLOSED mode, the low-side terminal is electrically connected to circuit common. IN the OPEN mode, the low-side terminal is electrically isolated from circuit common. The low-side driver integrated circuit and the controllable switch are configured to simultaneously operate in the ON mode and the CLOSED mode, respectively, and in the OFF mode and the OPEN mode, respectively.

In still another exemplary embodiment, a low-side driver circuit includes a voltage source, a circuit common node, a load, a low-side driver integrated circuit, and a controllable switch. The load is electrically coupled in series with the voltage source and the circuit common node. The low-side driver integrated circuit includes a high-side terminal, a low-side terminal, and a control terminal. The control terminal is adapted to receive an on-off command input signal and is configured, upon receipt of the on-off command input signal, to selectively operate in an ON mode and an OFF mode. The controllable switch is connected to one of the high-side terminal and the low-side terminal, and is electrically coupled in series with the voltage source, the load, and the common node. The controllable switch is adapted to receive the on-off command signal and is configured, in response thereto, to selectively operate in a CLOSED mode and an OPEN mode. The low-side driver integrated circuit and the controllable switch are configured to simultaneously operate in the ON mode and the CLOSED mode, respectively, whereby current flows from the voltage source through the load, and in the OFF mode and the OPEN mode, respectively, whereby current does not flow from the voltage source through the load.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Figure 1:
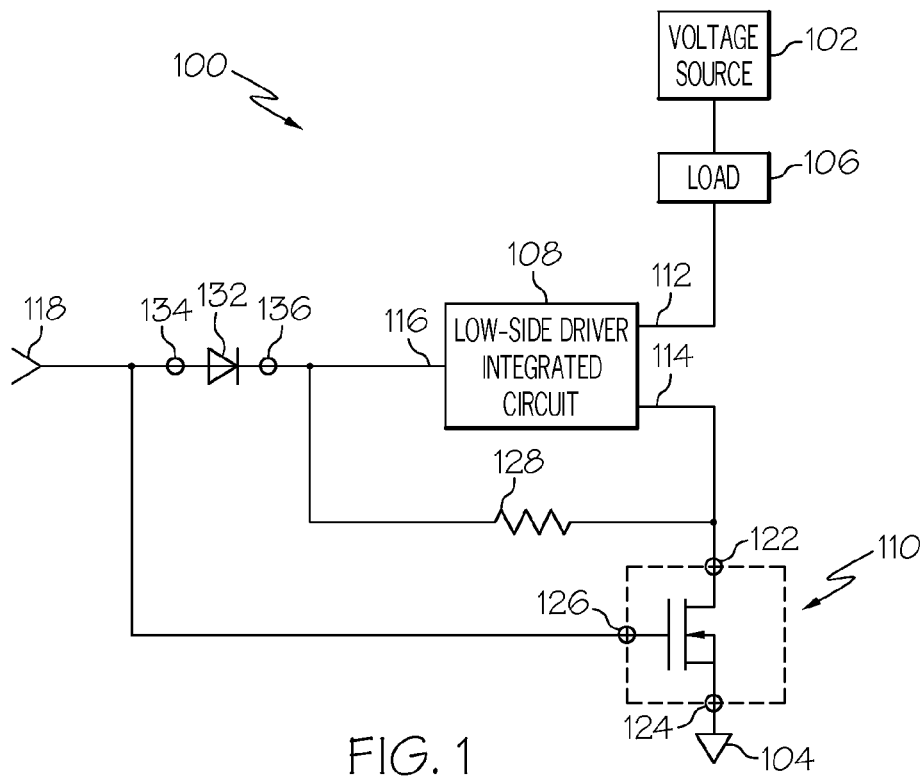
FIG. 1 is schematic block diagram of a preferred exemplary embodiment of a low-side driver circuit that includes high-voltage transient protection.

A low-side driver circuit for selectively energizing a load from a voltage source, and that implements high-voltage transient protection, is depicted in FIG. 1. The circuit 100 includes a voltage source 102, a circuit common node 104, a load 106, a low-side driver integrated circuit 108, and a controllable switch 110. The voltage source 102 may be any one of numerous electrical power sources or systems, or may be a part of any one of these numerous electrical power sources or systems. For example, the voltage source 102 may be an electrical power bus that is energized from one or more electrical power sources, or it may be a power source such as, for example, a battery, an electromechanical generator, or various other electrical power sources. No matter the specific implementation, the voltage source 102 may exhibit, or be subject to, relatively high-voltage transients.

The load 106 is electrically coupled in series with the voltage source 102, the circuit common node 104, the low-side driver integrated circuit 108, and the controllable switch 110. The load 106 may be variously implemented. For example, it may be one or more lamps, one or more relays, various combinations of these devices, or any one or more of numerous other devices that may be desirable to controllably energize from the voltage source 102. As may be readily apparent, the load 106 is controllably energized via the low-side driver integrated circuit 108 and the controllable switch 110, both of which will now be described.

The low-side driver integrated circuit 108 includes a high-side terminal 112, a low-side terminal 114, and a control terminal 116. It will be appreciated that in most embodiments the low-side driver integrated circuit will likely include additional terminals. However, a description of these additional terminals is not needed to fully describe or enable the claimed invention, and as such will not be provided. It will additionally be appreciated that may be implemented using any one of numerous known low-side driver integrated circuits presently known or developed in the future. One particular example of a presently known low-side driver integrated circuit is the HITFET BSP 75N produced by Infineon Technologies.

No matter the specific implementation of the low-side driver integrated circuit 108, as FIG. 1 depicts the high-side terminal 112 is connected to the load 106, the low-side terminal is connected to the controllable switch 110, and the control terminal 116 is coupled to receive an on-off command input signal 118. The low-side driver integrated circuit 108 is configured to be responsive to the on-off command input signal 118 to selectively operate in one of two modes. These modes are referred to herein as an "ON mode" and an "OFF mode." In the ON mode, the low-side driver integrated circuit 108 exhibits a relatively low electrical resistance path between the high-side terminal 112 and the low-side terminal 114. As a result, current may flow between the high-side terminal 112 and the low-side terminal 114 depending, as will be described momentarily, upon the state of the controllable switch 110. Conversely, in the OFF mode, the low-side driver integrated circuit 108 exhibits a relatively high electrical resistance path (e.g., a substantially open circuit) between the high-side terminal 112 and the low-side terminal 114. As a result, current flow between the high-side terminal 112 and the low-side terminal 114 is prevented (or at least substantially prevented).

The controllable switch 110 is connected in series between the low-side driver integrated circuit low-side terminal 114 and the circuit common node 104. As FIG. 1 additionally depicts, the controllable switch 110 is also coupled to receive the on-off command input signal 118. Similar to the low-side driver integrated circuit 108, the controllable switch 110 is configured to be responsive to the on-off command input signal 118 to selectively operate in one of two modes. These modes are referred to herein as a "CLOSED mode" and an "OPEN mode." In the CLOSED mode, the controllable switch 110 exhibits a relatively low electrical resistance, whereas in the OPEN mode, the controllable switch 110 exhibits a relatively high electrical resistance (e.g., a substantially open circuit).

Because the low-side driver integrated circuit 108 and the controllable switch 110 both receive the on-off command input signal 118, these devices will simultaneously switch between their respective operational modes. In particular, the low-side driver integrated circuit 108 and the controllable switch 110 are configured to simultaneously operate in the ON mode and the CLOSED mode, respectively, and in the OFF mode and the OPEN mode, respectively. It may thus be appreciated that when the low-side driver integrated circuit 108 and the controllable switch 110 are simultaneously operating in the ON mode and the CLOSED mode, respectively, current flows from the voltage source 102 through the load 106. Conversely, when low-side driver integrated circuit 108 and the controllable switch 110 are simultaneously operating in the OFF mode and the OPEN mode, respectively, current does not flow from the voltage source 102 through the load 106.

The controllable switch 110 may be variously implemented using any one of numerous known controllable switching devices. In the depicted embodiment, however, the controllable switch 110 is implemented using a metal-oxide semiconductor field effect transistor (MOSFET), and more specifically an N-channel MOSFET. In this embodiment the controllable switch (MOSFET) 110 includes a source terminal 122, a drain terminal 124, and a gate terminal 126. The drain terminal 122 is connected to the low-side driver integrated circuit low-side terminal 114, the source terminal 124 is connected to the common node 104, and the gate terminal 126 is connected to receive the on-off command input signal 118. Before proceeding further, it will be appreciated that in other embodiments the controllable switch 110 may be implemented using various other types of transistors. Moreover, when implemented using a MOSFET, the controllable switch 110 may be, at least in some embodiments, an appropriately configured P-channel MOSFET.

To ensure proper circuit operation, the circuit 100 additionally includes a resistor 128 and a diode 132. The resistor 128 is connected between the drain terminal 122 and the low-side driver integrated circuit control terminal 116, and the diode 132 is connected between the gate terminal 126 and the low-side driver integrated circuit control terminal 116. More specifically, the diode cathode 136 is coupled to the low-side driver integrated circuit control terminal 116, and the diode anode 134 is connected to the gate terminal 126. As may be readily appreciated by the skilled artisan, the resistor 128 prevents the low-side driver integrated circuit 108 configuring itself to operate in the ON mode in the absence of an appropriate on-off command input signal 118. As will now be described, the diode 132 prevents a voltage transient, if one were to occur, from causing the controllable switch 110 to unintentionally operate in the CLOSED mode.

From the above, it may be readily understood that when it is desired to energize the load 106, an appropriate on-off command input signal 118 is supplied to the circuit 100. Upon receipt of this signal 118, the low-side driver integrated circuit 108 and the controllable switch 110 will simultaneously operate in the ON mode and the CLOSED mode, respectively.

It may be appreciated that if the voltage source 102 were to experience an undesirable voltage transient while the circuit 100 is in this configuration, the low-side driver integrated circuit 108 internal overcurrent protection and/or temperature limiting circuits would provide suitable protection. Now, when it is desired to deenergize the load 106, the on-off command input signal 118 is no longer supplied (or appropriately supplied) to the circuit 100. As a result, the low-side driver integrated circuit 108 and the controllable switch 110 will simultaneously operate in the OPEN mode, respectively. Should the voltage source 102 experience an undesirable voltage transient occur while the circuit 100 is in this configuration, because of the configuration of the low-side driver integrated circuit 108, the voltage at its high-side terminal 112 would increase activating the over-voltage protection circuit internal to the low-side driver integrated circuit 108. This internal over-voltage protection works by changing the low-side driver integrated circuit 108 to the ON state. The voltage seen by the low-side terminal 114 and control terminal 116 would then increase. The diode 132 prevents the controllable switch 110 from being switched to the CLOSED mode now that the voltage has increased on the control terminal 116. Hence, the voltage potential of the transient is experienced only across the controllable switch 110.

The low-side driver integrated circuit 108 is implemented using a device with a relatively low voltage rating, whereas the controllable switch 110 is implemented using a device (e.g., MOSFET) that has a relatively higher voltage rating. The specific voltage ratings of the devices may vary depending, for example, on the nominal operating voltage of the system in which the circuit 100 is installed and on the potential high-voltage transient that the system may experience. With this configuration, a relatively low-cost low-side driver integrated circuit 108, which uses a relatively small circuit board area and exhibits relatively high reliability, may be used.

Figure 2:
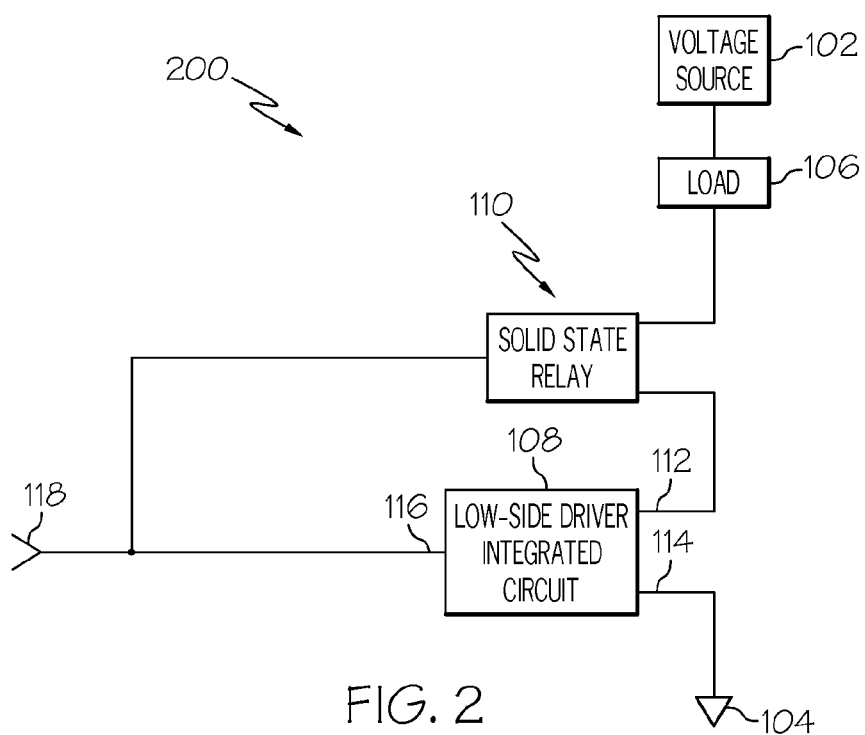
FIG. 2 is schematic block diagram of an exemplary alternative embodiment of a low-side driver circuit that includes high-voltage transient protection.

In the embodiment depicted in FIG. 1, the controllable switch 110 is connected in series between the low-side driver integrated circuit low-side terminal 114 and the common node 104. It will be appreciated that this is merely exemplary of a particular preferred configuration and that the circuit may be alternatively configured. For example, an alternative circuit 200 configuration is depicted in FIG. 2, in which the controllable switch 110, which is preferably implemented using a solid state relay, is connected in series between the load 106 and the low-side driver integrated circuit high-side terminal 112. Moreover, the low-side driver integrated circuit low-side terminal 114 is connected to the circuit common node 104. The operation of the alternative configuration will be readily apparent to the skilled artisan. As such, a description thereof need not, and will not, be provided.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A low-side driver circuit, comprising:
a low-side driver integrated circuit including a high-side terminal, a low-side terminal, and a control terminal, the control terminal adapted to receive an on-off command input signal, the low-side driver integrated circuit configured, upon receipt of the on-off command input signal, to selectively operate in an ON mode, in which current may flow from the high-side terminal to the low-side terminal may occur, and an OFF mode, in which current flow from the high-side terminal to the low-side terminal is at least substantially prevented; and
a controllable switch connected between the low-side terminal and circuit common, the controllable switch adapted to receive the on-off command signal and configured, in response thereto, to selectively operate in a CLOSED mode, in which the low-side terminal is electrically connected to circuit common, and an OPEN mode, in which the low-side terminal is electrically isolated from circuit common, the controllable switch comprising a metal-oxide field effect transistor (MOSFET) having a source terminal, a gate terminal, and a drain terminal, the drain terminal connected to the low-side terminal, the gate terminal adapted to receive the on-off command input signal, the source terminal connected to circuit common; and
a resistor connected between the drain terminal and the control terminal,
wherein the low-side driver integrated circuit and the controllable switch are configured to simultaneously operate in the ON mode and the CLOSED mode, respectively, and in the OFF mode and the OPEN mode, respectively.

2. The circuit of claim 1, wherein:
the low-side driver integrated circuit has a first voltage rating;
the controllable switch has a second voltage rating; and
the first voltage rating is less than the second voltage rating.

3. The circuit of claim 1, further comprising a diode having an anode and a cathode, the anode connected to the gate terminal and adapted to receive the on-off command input signal, the cathode connected to the control terminal.

4. A low-side driver circuit for selectively energizing a load from a voltage source, comprising:
a low-side driver integrated circuit including a high-side terminal, a low-side terminal, and a control terminal, the high-side terminal adapted to be coupled to the load, the control terminal adapted to receive an on-off command input signal, the low-side driver integrated circuit configured, upon receipt of the on-off command input signal, to selectively operate in (i) an ON mode, in which the low-side driver integrated circuit allows current to flow from the voltage source, through the load and the high-side terminal, to the low-side terminal, and (ii) an OFF mode, in which the low-side driver integrated circuit at least substantially prevents current flow from the voltage source, through the load and the high-side terminal, to the low-side terminal; and
a controllable switch connected between the low-side terminal and circuit common, the controllable switch adapted to receive the on-off command signal and configured, in response thereto, to selectively operate in a CLOSED mode, in which the low-side terminal is electrically connected to circuit common, and an OPEN mode, in which the low-side terminal is electrically isolated from circuit common, the controllable switch comprising a metal-oxide field effect transistor (MOSFET)

having a source terminal, a gate terminal, and a drain terminal, the drain terminal connected to the low-side terminal, the gate terminal adapted to receive the on-off command input signal, the source terminal connected to circuit common; and a diode having an anode and a cathode, the anode connected to the gate terminal and adapted to receive the on-off command input signal, the cathode connected to the control terminal, wherein the low-side driver integrated circuit and the controllable switch are configured to simultaneously operate in the ON mode and the CLOSED mode, respectively, and in the OFF mode and the OPEN mode, respectively.

5. The circuit of claim 4, wherein:

the low-side driver integrated circuit has a first voltage rating;

the controllable switch has a second voltage rating; and the first voltage rating is less than the second voltage rating.

6. The circuit of claim 4, further comprising a resistor connected between the drain terminal and the control terminal.

7. A low-side driver circuit, comprising:

voltage source;

a circuit common node;

a load electrically coupled in series with the voltage source and the circuit common node;

a low-side driver integrated circuit including a high-side terminal, a low-side terminal, and a control terminal, the control terminal adapted to receive an on-off command input signal, the low-side driver integrated circuit configured, upon receipt of the on-off command input signal, to selectively operate in an ON mode and an OFF mode; and a controllable switch connected to the high-side terminal and electrically coupled in series with the voltage source, the load, and the common node, the controllable switch adapted to receive the on-off command signal and configured, in response thereto, to selectively operate in a CLOSED mode and an OPEN mode, wherein the low-side driver integrated circuit and the controllable switch are configured to simultaneously operate in:

(i) the ON mode and the CLOSED mode, respectively, whereby current flows from the voltage source through the load, and (ii) in the OFF mode and the OPEN mode, respectively, whereby current does not flow from the voltage source through the load; and wherein:

the low-side driver integrated circuit has a first voltage rating;

the controllable switch has a second voltage rating; and the first voltage rating is less than the second voltage rating.

8. The circuit of claim 7, the controllable switch comprises a metal-oxide field effect transistor (MOSFET) having a source terminal, a gate terminal, and a drain terminal, the source terminal connected to the high-side terminal, the gate terminal adapted to receive the on-off command input signal, the drain terminal connected to the voltage source and load.

9. The circuit of claim 8, further comprising a resistor connected between the source terminal and the gate terminal.

10. The circuit of claim 8, further comprising a diode having an anode and a cathode, the anode connected to the control terminal and adapted to receive the on-off command input signal, the cathode connected to the gate terminal.

11. The circuit of claim 7, wherein the controllable switch comprises a solid state relay having a first terminal, a second terminal, and a third terminal, the first terminal connected to the load, the second terminal adapted to receive the on-off command input signal, the third terminal connected to the high-side terminal.

\* \* \* \* \*